（12) United States Patent
Bajwa et al.

(10) Patent No.: US 12,381,175 B2
(45) Date of Patent: Aug. 5, 2025

(54) BONDING SYSTEMS, AND METHODS OF PROVIDING A REDUCING GAS ON A BONDING SYSTEM

(71) Applicant: Kulicke and Soffa Industries, Inc., Fort Washington, PA (US)

(72) Inventors: Adeel Ahmad Bajwa, Blue Bell, PA (US); Thomas J. Colosimo, Jr., West Chester, PA (US); Matthew B. Wasserman, Radnor, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 18/768,219

(22) Filed: Jul. 10, 2024

(65) Prior Publication Data

US 2024/0363580 A1    Oct. 31, 2024

Related U.S. Application Data

(62) Division of application No. 18/123,166, filed on Mar. 17, 2023, now Pat. No. 12,062,636.

(60) Provisional application No. 63/328,771, filed on Apr. 8, 2022.

(51) Int. Cl.
*B23K 1/00* (2006.01)
*B23K 20/16* (2006.01)
*H01L 23/00* (2006.01)

(52) U.S. Cl.
CPC ............ *H01L 24/75* (2013.01); *B23K 1/0016* (2013.01); *B23K 20/16* (2013.01); *H01L 2224/751* (2013.01)

(58) Field of Classification Search
CPC . H01L 24/75; H01L 2224/751; B23K 1/0016; B23K 2101/36–42; B23K 20/16; B23K 20/18; B23K 1/012; B23K 35/38–386
USPC ................... 228/42, 179.1–180.22, 218–220
See application file for complete search history.

(56) References Cited

U.S. PATENT DOCUMENTS

| 9,119,336 B2 | 8/2015 | Abe et al. |
| 10,861,820 B2 | 12/2020 | Bajwa |
| 11,205,633 B2 | 12/2021 | Bajwa et al. |
| 2010/0237498 A1 | 9/2010 | Kim et al. |

(Continued)

FOREIGN PATENT DOCUMENTS

| KR | 10-2009-0043137 A | 5/2009 | |
| KR | 10-2013-0087407 A | 8/2013 | |
| WO | WO-0138032 A1 * | 5/2001 | ............. B23K 1/203 |

OTHER PUBLICATIONS

International Search Report for PCT application No. PCT/US2023/015557 mailed Jul. 6, 2023.

*Primary Examiner* — Kiley S Stoner
(74) *Attorney, Agent, or Firm* — Christopher M. Spletzer, Sr.

(57) ABSTRACT

A bonding system is provided. The bonding system includes (a) a bond head assembly configured for carrying a bonding tool for bonding a semiconductor element to a substrate and (b) a reducing gas conduit for carrying a reducing gas from (i) a reducing gas source to (ii) a bonding area of a bonding system. The reducing gas is configured for use during bonding of the semiconductor element to the substrate at the bonding area. The reducing gas conduit includes a catalyst for producing excess reducing species in the reducing gas prior to the reducing gas reaching the bonding area.

20 Claims, 14 Drawing Sheets

(56) References Cited

U.S. PATENT DOCUMENTS

| | | |
|---|---|---|
| 2012/0104076 A1 | 5/2012 | Suga et al. |
| 2013/0287644 A1 | 10/2013 | Chang et al. |
| 2021/0265303 A1 | 8/2021 | Bajwa et al. |
| 2023/0326903 A1* | 10/2023 | Bajwa .................... B23K 20/16 |
| 2024/0363580 A1* | 10/2024 | Bajwa .................... B23K 20/16 |

* cited by examiner

BONDING SYSTEMS, AND METHODS OF PROVIDING A REDUCING GAS ON A BONDING SYSTEM

CROSS REFERENCE TO RELATED APPLICATION

This application is a divisional application of U.S. patent application Ser. No. 18/123,166 filed on Mar. 17, 2023, which claims the benefit of U.S. Provisional Application No. 63/328,771, filed on Apr. 8, 2022, the contents of both of which are herein incorporated by reference.

FIELD

The invention relates to bonding systems and processes, and more particularly, to improved bonding systems and methods of providing a reducing gas on a bonding system.

BACKGROUND

Traditional semiconductor packaging typically involves die attach processes and wire bonding processes. Advanced semiconductor packaging technologies (e.g., flip chip bonding, thermocompression bonding, etc.) continue to gain traction in the industry. For example, in thermocompression bonding (i.e., TCB), heat and/or pressure (and sometimes ultrasonic energy) are used to form a plurality of interconnections between (i) electrically conductive structures on a semiconductor element and (ii) electrically conductive structures on a substrate.

In certain flip chip bonding or thermocompression bonding applications, the electrically conductive structures of the semiconductor element and/or the substrate may include copper structures (e.g., copper pillars) or other materials that are subject to oxidation and/or other contamination. In such applications, it is desirable to provide an environment suitable for bonding. Conventionally, such an environment may be provided by using a reducing gas at the bonding area to reduce potential oxidation and/or contamination of the electrically conductive structures of the semiconductor element or the substrate to which it will be bonded.

Thus, it would be desirable to provide improved bonding systems, and methods of providing a reducing gas on bonding systems.

SUMMARY

According to an exemplary embodiment of the invention, a bonding system is provided. The bonding system includes (a) a bond head assembly configured for carrying a bonding tool for bonding a semiconductor element to a substrate and (b) a reducing gas conduit for carrying a reducing gas from (i) a reducing gas source to (ii) a bonding area of a bonding system. The reducing gas is configured for use during bonding of the semiconductor element to the substrate at the bonding area. The reducing gas conduit includes a catalyst for producing excess reducing species in the reducing gas prior to the reducing gas reaching the bonding area.

According to another exemplary embodiment of the invention, another bonding system is provided. The bonding system includes (a) a bond head assembly configured for carrying a bonding tool for bonding a semiconductor element to a substrate and (b) a reducing gas conduit for carrying a reducing gas from (i) a reducing gas source to (ii) a bonding area of a bonding system. The reducing gas is configured for use during bonding of the semiconductor element to the substrate at the bonding area. The reducing gas conduit includes a noble metal structure provided in at least one of (a) a mesh configuration within the reducing gas conduit, (b) a perforated block configuration within the reducing gas conduit, and (c) a configuration covering an inner surface of the reducing gas conduit.

According to yet another exemplary embodiment of the invention, another bonding system is provided. The bonding system includes (a) a bond head assembly configured for carrying a bonding tool for bonding a semiconductor element to a substrate and (b) a reducing gas conduit for carrying a reducing gas from (i) a reducing gas source to (ii) a bonding area of a bonding system. The reducing gas is configured for use during bonding of the semiconductor element to the substrate at the bonding area. The reducing gas conduit includes a catalyst provided in at least one of (a) a mesh configuration within the reducing gas conduit, (b) a perforated block configuration within the reducing gas conduit, and (c) a configuration covering an inner surface of the reducing gas conduit.

According to yet another exemplary embodiment of the invention, a method of providing a reducing gas on a bonding system is provided. The method includes the steps of: (a) providing a bonding tool for bonding a semiconductor element to a substrate; (b) carrying a reducing gas in a reducing gas conduit, the reducing gas conduit extending between (i) a reducing gas source and (ii) a bonding area of a bonding system, where the reducing gas is configured for use during bonding of the semiconductor element to the substrate at the bonding area; and (c) producing excess reducing species in the reducing gas using a catalyst while the reducing gas is carried in the reducing gas conduit.

According to yet another exemplary embodiment of the invention, another method of providing a reducing gas on a bonding system is provided. The method includes the steps of: (a) providing a bonding tool for bonding a semiconductor element to a substrate; (b) carrying a reducing gas in a reducing gas conduit, the reducing gas conduit extending between (i) a reducing gas source and (ii) a bonding area of a bonding system, where the reducing gas is configured for use during bonding of the semiconductor element to the substrate at the bonding area; and (c) producing excess reducing species in the reducing gas using a noble metal structure while the reducing gas is carried in the reducing gas conduit, the noble metal structure provided in at least one of (i) a mesh configuration within the reducing gas conduit, (ii) a perforated block configuration within the reducing gas conduit, and (iii) a configuration covering an inner surface of the reducing gas conduit.

According to yet another exemplary embodiment of the invention, another method of providing a reducing gas on a bonding system is provided. The method includes the steps of: (a) providing a bonding tool for bonding a semiconductor element to a substrate; (b) carrying a reducing gas in a reducing gas conduit, the reducing gas conduit extending between (i) a reducing gas source and (ii) a bonding area of a bonding system, where the reducing gas is configured for use during bonding of the semiconductor element to the substrate at the bonding area; and (c) producing excess reducing species in the reducing gas using a catalyst while the reducing gas is carried in the reducing gas conduit, the catalyst provided in at least one of (i) a mesh configuration within the reducing gas conduit, (ii) a perforated block configuration within the reducing gas conduit, and (iii) a configuration covering an inner surface of the reducing gas conduit.

The methods of the invention may also be embodied as an apparatus (e.g., as part of the intelligence of a wire bonding machine), or as computer program instructions on a computer readable carrier (e.g., a computer readable carrier including a wire bonding program used in connection with a wire bonding machine).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

Figure 1:
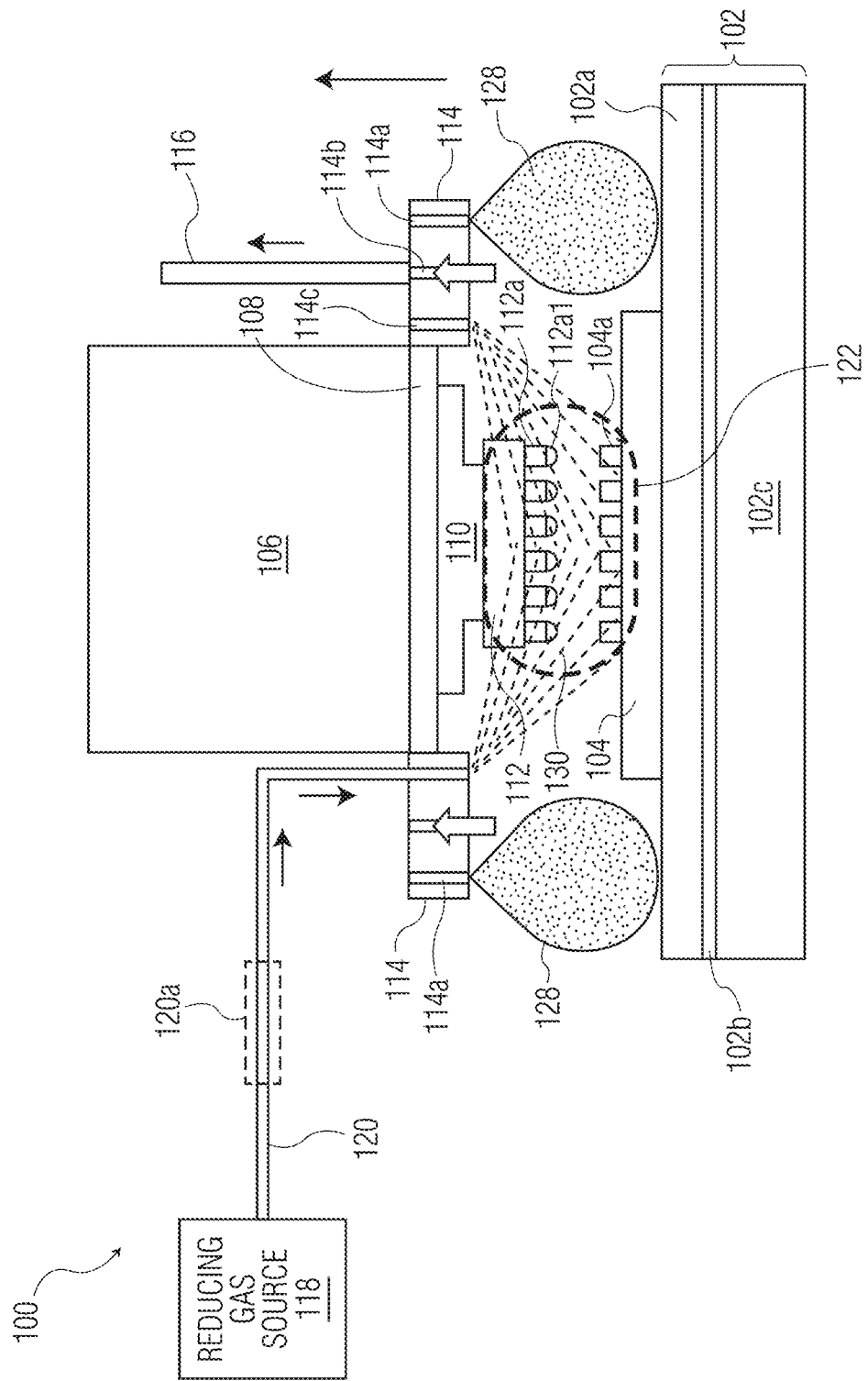
FIGS. 1-4 are block diagram side views illustrating bonding systems configured to provide reducing gas to a bonding area in accordance with various exemplary embodiments of the invention.

According to exemplary aspects of the invention, a reducing gas (e.g., a formic acid vapor) helps to reduce oxides from the conductive structures of a semiconductor element, and from the conductive structures of a substrate to which the semiconductor element is to be bonded. Examples of such conductive structures include conductive pads, conductive leads, conductive traces, and conductive pillars. Examples of materials in the conductive structures include copper, solder, AgSn, indium-based solder, among many others.

Oxides from the conductive structures may be reduced using the reducing gas by producing intermediate metal-formate species, and by a subsequent thermal decomposition to metal and other gaseous species. Such processes generally require a high temperature (e.g., 200-300° C.) for oxide reduction, during bonding (e.g., thermocompression bonding) of solder-to-solder, solder-to-metal, and metal-metal interconnects.

According to certain exemplary embodiments of the invention, the high temperature requirements for reducing oxides from the surfaces of the conductive structures may be reduced. For example, exemplary methods utilize a reaction of a reducing gas (e.g., a formic acid vapor) with a catalyst such as a noble metal (e.g., platinum, palladium, gold, etc.). Further, such a reaction may occur at an elevated temperature (e.g., 100-200° C.). As a result, excess reducing species (e.g., H+ ions) are produced in the reducing gas because of a catalytic conversion. The excess reducing species help to further reduce the oxides from the target surfaces (e.g., from the surfaces of the conductive structures of a semiconductor element and/or from the surfaces of a substrate to which the semiconductor element will be bonded). The presence of these excess (additional) reducing species further decreases the temperature requirement during the bonding process (e.g., bonding of the semiconductor element to the substrate).

Exemplary bonding systems according to the invention may include one or more of the following: a reducing gas conduit for carrying a reducing gas; a heater (e.g., an inline heater) for heating at least a portion of the reducing gas conduit (e.g., a catalyst region of the reducing gas conduit); a catalyst (e.g., a noble metal structure such as a mesh, a perforated block, or a covering such as a plating or coating, etc.) provided in the reducing gas conduit. The temperature of the catalyst may be adjusted, for example, using closed loop controls.

Each of U.S. Pat. No. 10,861,820 (entitled "METHODS OF BONDING SEMICONDUCTOR ELEMENTS TO A SUBSTRATE, INCLUDING USE OF A REDUCING GAS, AND RELATED BONDING MACHINES"), U.S. Pat. No. 11,205,633 (entitled "METHODS OF BONDING SEMICONDUCTOR ELEMENTS TO SUBSTRATES, AND RELATED BONDING SYSTEMS"), and U.S. Patent Application Publication No. 2021/0265303 (entitled "METHODS OF BONDING SEMICONDUCTOR ELEMENTS TO SUBSTRATES, AND RELATED BONDING SYSTEMS"), relate to bonding systems utilizing a reducing gas, and are hereby incorporated herein by reference in their entirety.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded. Exemplary substrates include, for example, a leadframe, a PCB, a carrier, a module, a semiconductor chip, a semiconductor wafer, a BGA substrate, another semiconductor element, etc.

As used herein, the term "catalyst" refers to a structure used to produce excess reducing species in a reducing gas, for example, in a heated reducing gas conduit. Such a catalyst may be a noble metal structure formed of (or including) ruthenium (Ru), rhodium (Rh), palladium (Pd), iridium (Ir), platinum (Pt), and gold (Au). Further, depending on the specific application, the catalyst may be formed of (or include) nickel, copper, silver, or another suitable material.

As used herein, the term "catalyst region" shall refer to a portion of a reducing gas conduit (which is any type of pipe, tubing, or structure housing the reducing gas) including a catalyst. The catalyst region may extend along any portion of the length of the reducing gas conduit as desired in the application.

As will be appreciated by those skilled in the art, a reducing gas (e.g., a formic acid vapor) includes reducing species. Through a reaction with a catalyst (e.g., with heat), additional reducing species (also referred to as excess reducing species) are produced in the reducing gas. H+ ions are an example of such additional reducing species.

Referring now to the drawings, FIG. 1 illustrates a bonding system 100 (e.g., a flip chip bonding machine, a thermocompression bonding machine, etc.). Bonding system 100 includes a support structure 102 for supporting a substrate 104 during a bonding operation (where substrate 104 includes a plurality of electrically conductive structures 104a). Support structure 102 may include any appropriate structure for the specific application. In the illustrated embodiment, support structure 102 includes a top plate 102a (configured to directly support substrate 104), a chuck 102c, and a heater 102b disposed therebetween.

Bonding system 100 also includes a bond head assembly 106, which may be configured to move along (and about) a plurality of axes of bonding system 100 such as, for example, the x-axis, y-axis, z-axis, theta (rotative) axis, etc. Bond head assembly 106 includes and/or carries a heater 108 and a bonding tool 110. In certain bonding machines (e.g., thermocompression bonding machines) it may be desirable to heat bonding tool 110. While FIG. 1 illustrates a separate heater 108 for heating bonding tool 110 (for heating a semiconductor element 112 including a plurality of electrically conductive structures 112a), it will be appreciated that heater 108 and bonding tool 110 may be integrated into a single element (e.g., a heated bonding tool).

In connection with a bonding operation, semiconductor element 112 is bonded to substrate 104 using bonding tool 110. During the bonding operation, corresponding ones of electrically conductive structures 112a are bonded (e.g., using heat, force, ultrasonic energy, etc.) to respective ones of electrically conductive structures 104a. In FIG. 1, electrically conductive structures 112a include a solder material 112a1 at a contact portion of each electrically conductive structure 112a (e.g., a portion configured to contact the electrically conductive structures 104a of substrate 104).

In certain bonding applications (e.g., thermocompression bonding, flip chip bonding, etc.), it is desirable to provide an environment suitable for bonding. Conventionally, such an environment may be provided by using a reducing gas at the bonding area to reduce potential oxides of the electrically conductive structures of the semiconductor element or the substrate to which it will be bonded.

In FIG. 1, bond head assembly 106 carries a bond head manifold 114 for receiving and distributing fluids (e.g., gases, vapors, liquids, etc.) as desired in the given application. While bond head manifold 114 is illustrated in a cross-sectional view, the actual bond head manifold 114 surrounds bonding tool 110 (e.g., bond head manifold 114 surrounds bonding tool 110 in a coaxial configuration). Of course, bond head manifold 114 may have different configurations from that illustrated in FIG. 1. Further, it is understood that certain details of bond head manifold 114 are omitted for simplicity.

Bond head manifold 114 includes three channels 114a, 114b, 114c having different functions. An outer channel 114a receives a shielding gas (e.g., nitrogen gas) from a shielding gas supply (not illustrated). From outer channel 114a of bond head manifold 114, a shielding gas 128 is provided to shield a bonding area 122 from the outside environment. An inner channel 114c receives a reducing gas 130 (e.g., where reducing gas 130 may be a saturated vapor gas such as formic acid vapor, a reducing gas including excess reducing species, etc.) via a reducing gas conduit 120, and provides reducing gas 130 to bonding area 122 (e.g., where bonding area 122 is a location where semiconductor element 112 is bonded to substrate 104).

Reducing gas 130 is provided from a reducing gas source 118 (via reducing gas conduit 120). For example, reducing gas source 118 may be a bubbler type system including an acid fluid such as formic acid, acetic acid, or another acidic fluid (where the bubbler type system may be part of bonding system 100). In another example, reducing gas source 118 may be a vessel (e.g., a pressurized vessel such as a tank) or another source for directing reducing gas 130 to bonding system 100.

Reducing gas conduit 120 is configured for carrying reducing gas 130 from reducing gas source 118 to bonding area 122 of bonding system 100, where reducing gas 130 is configured for use during bonding of semiconductor element 112 to substrate 104 at bonding area 122. In the embodiment illustrated in FIG. 1, reducing gas conduit 120 is configured to provide reducing gas 130 to bond head assembly 106 and/or bond head manifold 114. Reducing gas conduit 120 includes a catalyst (e.g., where the catalyst is formed of, or includes, at least one noble metal such as platinum, palladium, gold, etc.) for producing excess reducing species (e.g., H+ ions) in reducing gas 130 prior to reducing gas 130 reaching bonding area 122. The catalyst may be provided in a number of different configurations (e.g., in a mesh configuration 120b1 of FIG. 7C, in a perforated block configuration 120b2 of FIG. 7D, on an inner surface of the reducing gas conduit of FIG. 7E, etc.). Reducing gas 130 is carried through a catalyst region 120a (i.e., where a catalyst is located) of reducing gas conduit 120, thereby chemically reacting with the catalyst to produce excess reducing species. A heater (e.g., an inline heater) may be used in connection with reducing gas conduit 120 and, more specifically, catalyst region 120a (e.g., see FIGS. 7A-7B and FIG. 8).

After reducing gas 130 is distributed in bonding area 122, reducing gas 130 contacts surfaces of each of electrically conductive structures 104a (of substrate 104) and electrically conductive structures 112a (of semiconductor element 112). The surfaces of electrically conductive structures 104a/112a may then include a reaction product (e.g., where the reaction product is provided as a result of (i) a surface oxide on electrically conductive structures 104a/112a, and (ii) reducing gas 130 (and possibly heat provided by heater 108 and transferred to electrically conductive structures 104a via contact with electrically conductive structures 112a, if desired). This reaction product is desirably removed from bonding area 122 using vacuum provided through a center channel 114b of bond head manifold 114 via exit piping 116.

Figure 2:
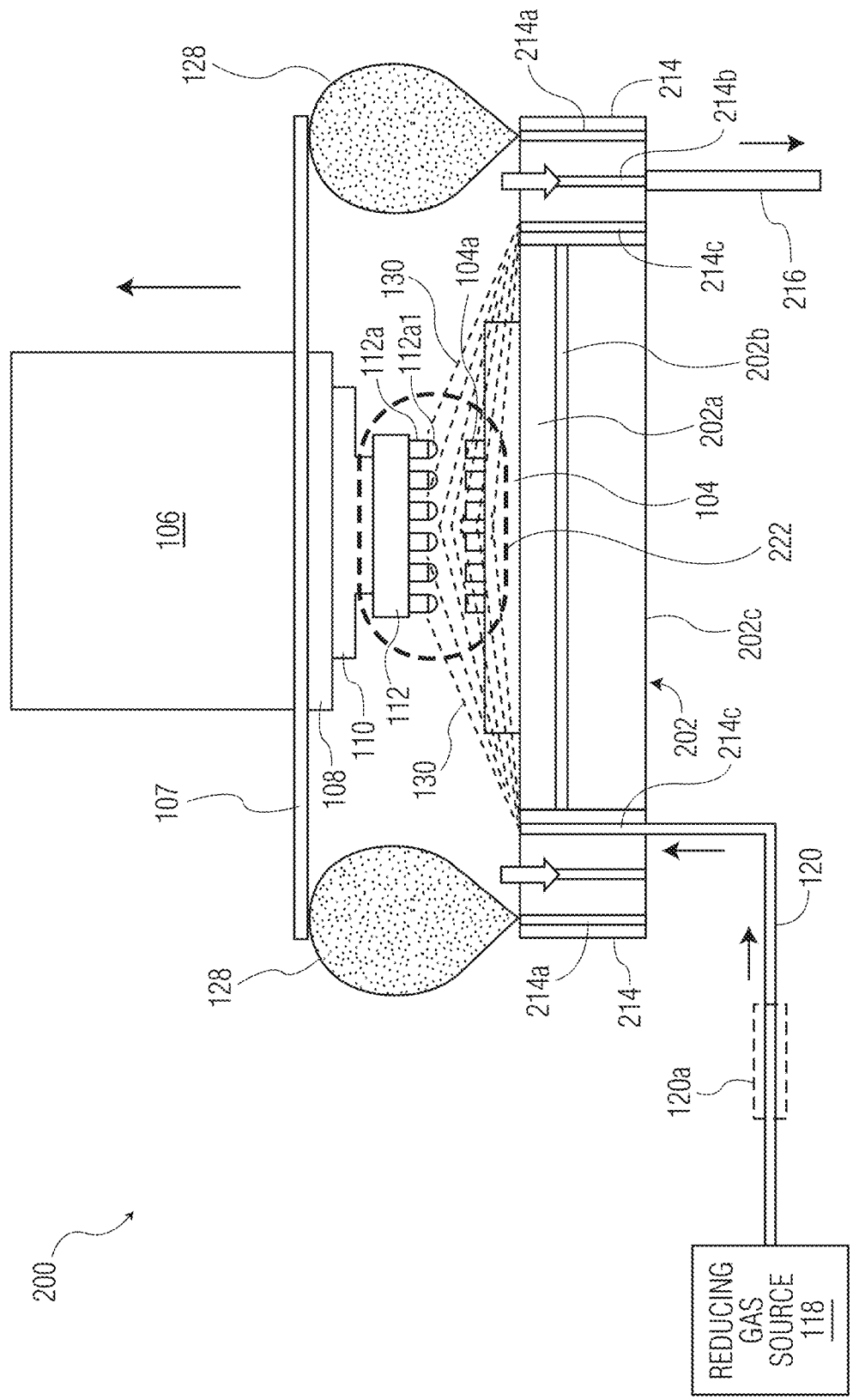

Referring now to FIG. 2, a bonding system 200 is illustrated. Bonding system 200 is similar in many ways to bonding system 100, where like elements have the same reference numeral or a numeral beginning with a "2" instead of a "1" (unless explicitly indicated otherwise). Bonding system 200 includes a support structure 202 for supporting a substrate 104. Support structure 202 includes a top plate 202a (configured to directly support substrate 104), a chuck 202c, and a heater 202b disposed therebetween.

Bonding system 200 also includes a bond head assembly 106 which may be configured to move along (and about) a plurality of axes of bonding system 200 such as, for example, the x-axis, y-axis, z-axis, theta (rotative) axis, etc. Bond head assembly 106 includes and/or carries a heater 108 and a bonding tool 110. Bonding tool 110 is illustrated carrying a semiconductor element 112 (including a plurality of electrically conductive structures 112a including solder material 112a1). Bond head assembly 106 is illustrated carrying a plate 107 for partially containing at least one of a shielding gas 128 and a reducing gas 130.

As opposed to a bond head manifold 114 carried by bond head assembly 106 (as in FIG. 1), FIG. 2 illustrates a manifold 214 carried by, and/or integrated with, support structure 202. Manifold 214 is configured for receiving and distributing fluids (e.g., gases, vapors, etc.) as desired in the given application. While manifold 214 is illustrated in a cross-sectional view, the actual manifold 214 at least partially surrounds substrate 104. Of course, manifold 214 may have different configurations from that illustrated in FIG. 2. Further, it is understood that certain details of manifold 214 (e.g., interconnection details with a reducing gas conduit 120, structural details for distributing reducing gas 130 within manifold 214, structural details for distributing shielding gas 128 within manifold 214, structural details for drawing a vacuum through a center channel 214b of manifold 214, etc.) are omitted for simplicity.

Manifold 214 includes three channels 214a, 214b, 214c having different functions. An outer channel 214a receives shielding gas 128 (e.g., nitrogen gas) from shielding gas supply (e.g., a nitrogen tank, a gas supply, etc.). From outer channel 214a of manifold 214, shielding gas 128 is provided to shield a bonding area 222 from the outside environment. An inner channel 214c receives reducing gas 130 via reducing gas conduit 120 and provides reducing gas 130 to bonding area 222 in connection with a bonding operation. Reducing gas 130 is provided from reducing gas source 118 and is carried by a reducing gas conduit 120.

Reducing gas conduit 120 is configured for carrying reducing gas 130 from reducing gas source 118 to bonding area 222 of bonding system 200, where reducing gas 130 is configured for use during bonding of semiconductor element 112 to substrate 104 at bonding area 222. In the embodiment illustrated in FIG. 2, reducing gas conduit 120 is configured to provide reducing gas 130 to support structure 202 (e.g., via manifold 214). Reducing gas conduit 120 includes a catalyst (e.g., where the catalyst is formed of, or includes, at least one noble metal such as platinum, palladium, gold, etc.) for producing excess reducing species (e.g., H+ ions) in reducing gas 130 prior to reducing gas 130 reaching bonding area 222. The catalyst may be provided in a number of different configurations (e.g., in a mesh configuration 120b1 of FIG. 7C, in a perforated block configuration 120b2 of FIG. 7D, on an inner surface of the reducing gas conduit of FIG. 7E, etc.). Reducing gas 130 is carried through a catalyst region 120a (i.e., where a catalyst is located) of reducing gas conduit 120, thereby chemically reacting with the catalyst to produce excess reducing species. A heater (e.g., an inline heater) may be used in connection with reducing gas conduit 120 and, more specifically, catalyst region 120a (e.g., see FIGS. 7A-7B and FIG. 8).

After reducing gas 130 is distributed in the area of semiconductor element 112 and substrate 104, reducing gas 130 contacts surfaces of each of electrically conductive structures 104a and electrically conductive structures 112a. The surfaces of electrically conductive structures 104a/112a may then include a reaction product (e.g., where the reaction product is provided as a result of: (i) a surface oxide on electrically conductive structures 104a/112a, and (ii) reducing gas from reducing gas 130 (and possibly heat provided by heater 108, if desired). This reaction product is desirably removed from the bonding area (i.e., the area where electrically conductive structures 112a of semiconductor element 112 are bonded to corresponding electrically conductive structures 104a of substrate 104) using vacuum provided through center channel 214b of manifold 214 via an exit piping 216.

Figure 3:
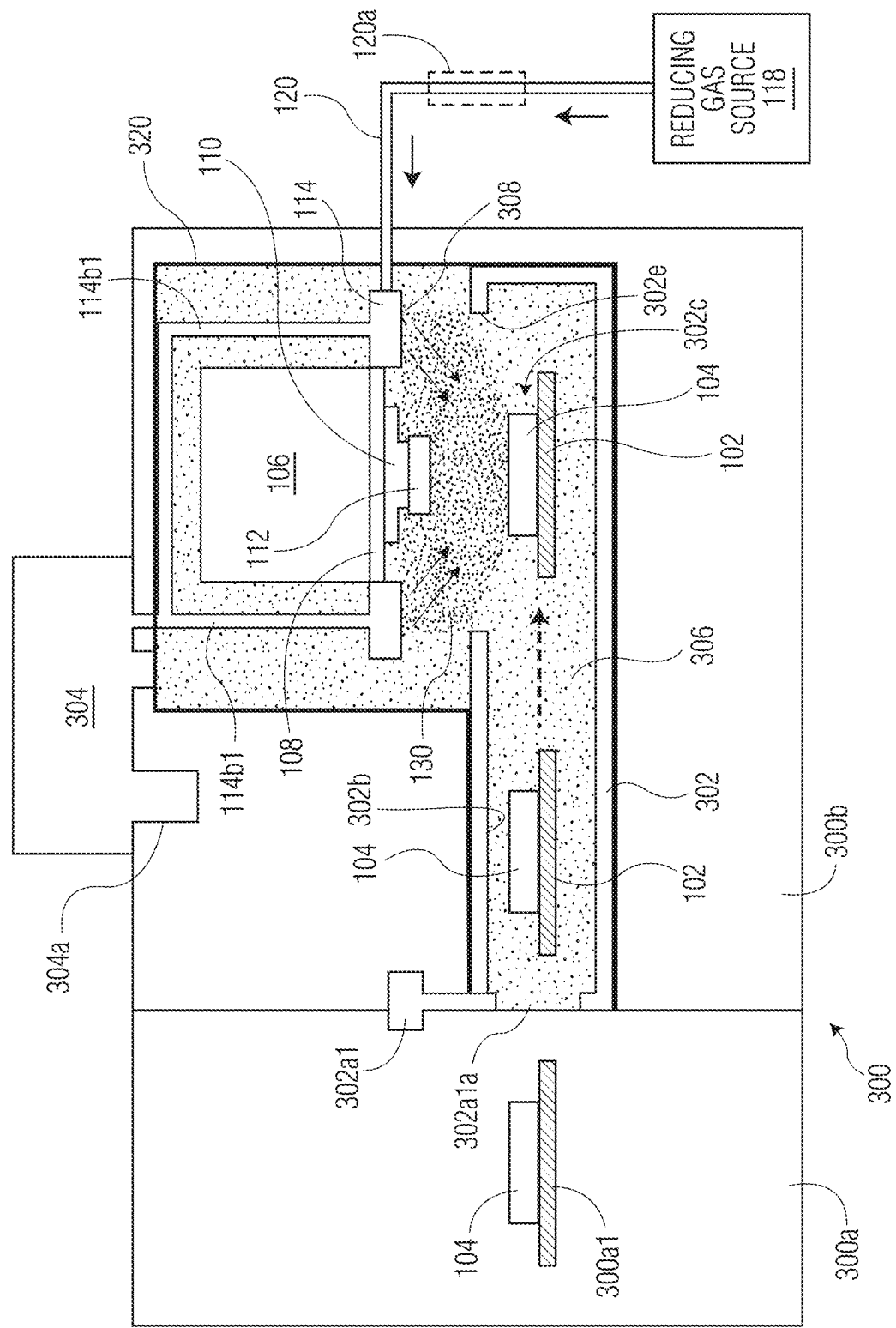

Referring now to FIG. 3, a bonding system 300 is illustrated. Bonding system 300 is similar in many ways to bonding system 100 of FIG. 1, where like elements have the same reference numerals, or a numeral beginning with a "3" instead of a "1" (unless explicitly indicated otherwise). Bonding system 300 includes: a substrate source 300a (e.g., a wafer handler or other source) for providing a substrate 104 (such as a wafer, a printed circuit board, etc.) on a support structure 300a1; and a processing system 300b. Substrate 104 is configured to be transferred to processing system 300b (e.g., including an inner environment chamber 320, including a tunnel 302). Tunnel 302 includes a substrate oxide prevention chamber 302b and a bonding location 302c (which is part of substrate oxide prevention chamber 302b). A reducing gas delivery system 308 (including bond head manifold 114, described herein) is also included in processing system 300b. Within processing system 300b (sometimes referred to as main machine compartment), inner environment chamber 320 may include at least a portion of substrate oxide prevention chamber 302b and reducing gas delivery system 308.

Bonding system 300 also includes a bond head assembly 106, including and/or carrying a heater 108 and a bonding tool 110. Details of an exemplary bond head assembly 106 are described in connection with FIG. 1. FIG. 3 also illustrates a main exhaust 304 which pulls exhaust gases (e.g., gases such as reducing gas vapors) from the processing system 300b or the inner environment chamber 320 through piping 304a and piping 114b1 (where piping 114b1 is coupled, directly or indirectly, to center channel 114b described in FIG. 1). Bond head assembly 106 carries a bond head manifold 114 for receiving and distributing fluids (e.g., gases, vapors, etc.) as desired in the given application. Bond head manifold 114 receives a reducing gas 130 from a reducing gas source 118 via a reducing gas conduit 120.

In the example illustrated in FIG. 3, tunnel 302 includes an entry door 302a1 (which closes an opening 302a1a). A substrate transfer system (which may be part of a material handling system, including a support structure 102) is used to transfer a substrate 104 through entry door 302a1 to substrate oxide prevention chamber 302b. Substrate oxide prevention chamber 302b includes an inert environment 306 (e.g., through a nitrogen supply, not illustrated for simplicity). A material handling system is used to move substrate 104 within substrate oxide prevention chamber 302b to a bonding location 302c. While at bonding location 302c, a reducing gas 130 is provided by reducing gas delivery system 308. Reducing gas 130 is provided from a reducing gas source 118 and is carried by a reducing gas conduit 120.

Reducing gas conduit 120 is configured for carrying reducing gas 130 from reducing gas source 118 to a bonding area (e.g., including bonding location 302c) of bonding system 300, where reducing gas 130 is configured for use during bonding of a semiconductor element 112 to substrate 104 at the bonding area. In the embodiment illustrated in FIG. 3, reducing gas conduit 120 is configured to provide reducing gas 130 to bond head assembly 106 and/or bond head manifold 114. Reducing gas conduit 120 includes a catalyst (e.g., where the catalyst is formed of, or includes, at least one noble metal such as platinum, palladium, gold, etc.) for producing excess reducing species (e.g., H+ ions) in reducing gas 130 prior to reducing gas 130 reaching the bonding area. The catalyst may be provided in a number of different configurations (e.g., in a mesh configuration 120b1 of FIG. 7C, in a perforated block configuration 120b2 of FIG. 7D, on an inner surface of the reducing gas conduit of FIG. 7E, etc.). Reducing gas 130 is carried through a catalyst region 120a (i.e., where a catalyst is located) of reducing gas conduit 120, thereby chemically reacting with the catalyst to produce excess reducing species. A heater (e.g., an inline heater) may be used in connection with reducing gas conduit 120 and, more specifically, catalyst region 120a (e.g., see FIGS. 7A-7B and FIG. 8).

In connection with a bonding operation, semiconductor element 112 (which is carried by bond head assembly 106 into tunnel 302 through an opening 302e) is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Bond head manifold 114 provides a reducing gas 130 (e.g., where the reducing gas may be a saturated vapor gas such as formic acid vapor) in the area of semiconductor element 112 and substrate 104 in connection with a bonding operation (in the illustrated example, reducing gas 130 is able to enter tunnel 302 through opening 302e). After reducing gas 130 is distributed in the area of semiconductor element 112 and substrate 104, reducing gas 130 contacts surfaces of each of electrically conductive structures of semiconductor element 112 and substrate 104.

Figure 4:
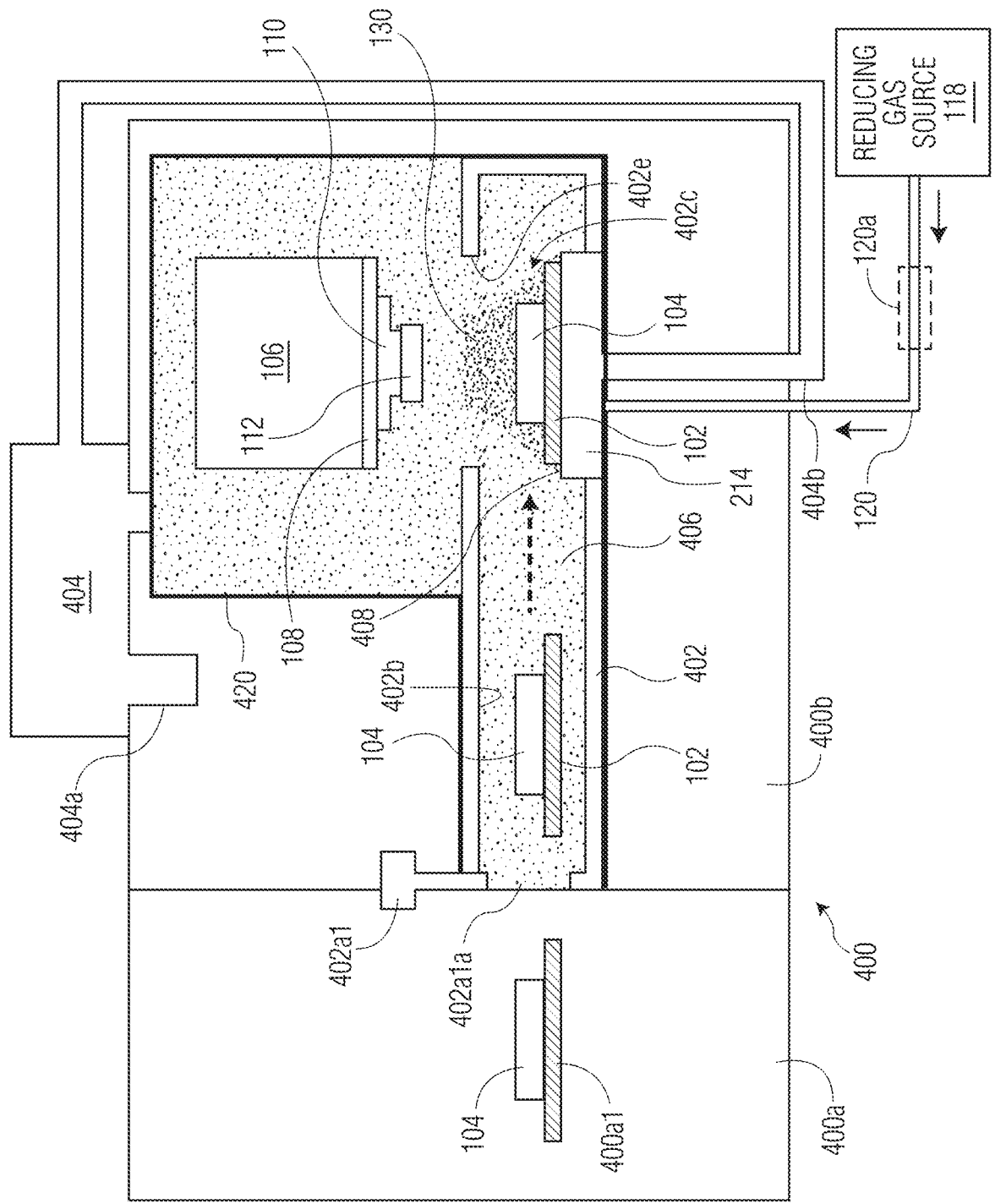

Referring now to FIG. 4, a bonding system 400 is illustrated. Bonding system 400 is similar in many ways to bonding system 200 of FIG. 2 and bonding system 300 of FIG. 3, where like elements have the same reference numerals, or a numeral beginning with a "4" instead of a "1", "2", or "3" (unless explicitly indicated otherwise). Bonding system 400 is essentially bonding system 300, but with manifold 214 of FIG. 2 (and associated structures) in lieu of bond head manifold 114 (and associated structures) of FIG. 1.

Bonding system 400 includes: a substrate source 400a (e.g., a wafer handler or other source) for providing a substrate 104 (such as a wafer, a printed circuit board, etc.) on a support structure 400a1; and a processing system 400b. Substrate 104 is configured to be transferred to processing system 400b (e.g., including an inner environment chamber 420, including a tunnel 402). Tunnel 402 includes a substrate oxide prevention chamber 402b and a bonding location 402c (which is part of substrate oxide prevention chamber 402b). Within processing system 400b (sometimes referred to as main machine compartment), inner environment chamber 420 may include at least a portion of substrate oxide prevention chamber 402b and reducing gas delivery system 408. Bonding system 400 also includes a bond head assembly 106, including and/or carrying a heater 108 and a bonding tool 110. In connection with a bonding operation, semiconductor element 112 (which is carried by bonding tool 110) extends through opening 402e) to be bonded to substrate 104.

In the example illustrated in FIG. 4, tunnel 402 includes an entry door 402a1 (which closes an opening 402a1a). A substrate transfer system (which may be part of a material handling system, including a support structure 102) is used to transfer a substrate 104 through entry door 402a1 to substrate oxide prevention chamber 402b. Substrate oxide prevention chamber 402b includes an inert environment 406 (e.g., through a nitrogen supply, not illustrated for simplicity). A material handling system is used to move substrate 104 within substrate oxide prevention chamber 402b to a bonding location 402c.

Bonding system 400 includes a main exhaust 404 which pulls exhaust gases (e.g., gases such as reducing gas vapors) through piping 404a and 404b. A processing system 400b is similar to processing system 300b, except processing system 400b includes a reducing gas delivery system 408 (including a manifold 214) in lieu of reducing gas delivery system 308 (including bond head manifold 114). Manifold 214 is provided for receiving and distributing fluids (e.g., gases, vapors, etc.) as desired in the given application. Manifold 214 receives a reducing gas 130 from a reducing gas source 118 via a reducing gas conduit 120.

Reducing gas conduit 120 is configured for carrying reducing gas 130 from reducing gas source 118 to a bonding area (e.g., including bonding location 402c) of bonding system 400, where reducing gas 130 is configured for use during bonding of a semiconductor element 112 to a substrate 104 at the bonding area. In the embodiment illustrated in FIG. 4, reducing gas conduit 120 is configured to provide reducing gas 130 to support structure 102 (e.g., via manifold 214 of reducing gas delivery system 408). Reducing gas conduit 120 includes a catalyst (e.g., where the catalyst is formed of, or includes, at least one noble metal such as platinum, palladium, gold, etc.) for producing excess reducing species (e.g., H+ ions) in reducing gas 130 prior to reducing gas 130 reaching the bonding area. The catalyst may be provided in a number of different configurations (e.g., in a mesh configuration 120b1 of FIG. 7C, in a perforated block configuration 120b2 of FIG. 7D, on an inner surface of the reducing gas conduit of FIG. 7E, etc.). Reducing gas 130 is carried through a catalyst region 120a (i.e., where a catalyst is located) of reducing gas conduit 120, thereby chemically reacting with the catalyst to produce excess reducing species. A heater (e.g., an inline heater) may be used in connection with reducing gas conduit 120 and, more specifically, catalyst region 120a (e.g., see FIGS. 7A-7B and FIG. 8).

Figure 5A:
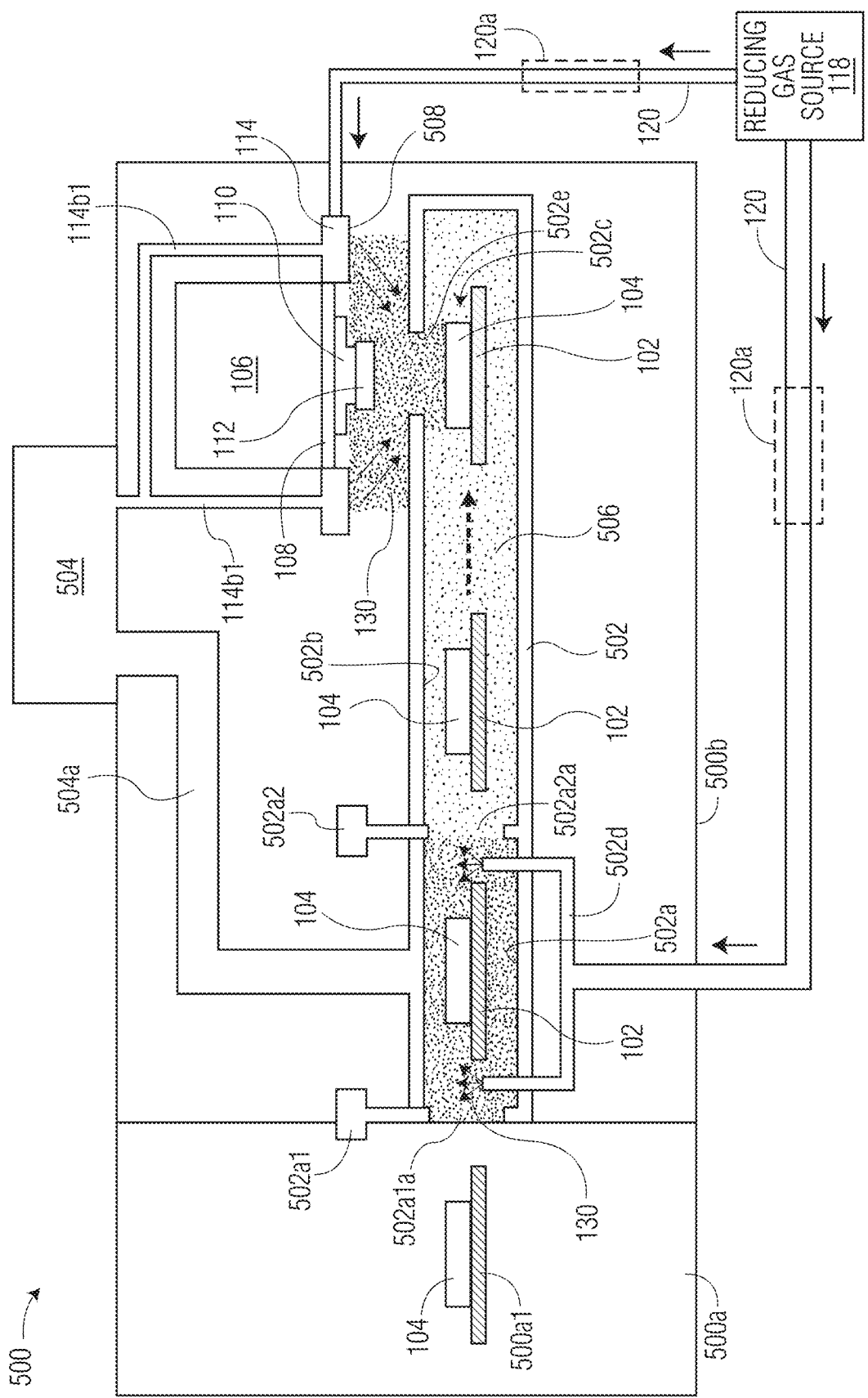
FIGS. 5A-5B and 6A-6B are block diagram side views illustrating bonding systems configured to provide reducing gas to a bonding area, and to a substrate oxide reduction chamber, in accordance with various exemplary embodiments of the invention.

Referring now to FIG. 5A, a bonding system 500 is illustrated. Bonding system 500 includes: a substrate source 500a (e.g., a wafer handler or other source) for providing a substrate(s) 104 (such as a wafer, a printed circuit board, etc.) on a support structure 500a1; and a processing system 500b. Substrate 104 is configured to be transferred to processing system 500b (e.g., including a tunnel 502). Tunnel 502 includes a substrate oxide reduction chamber 502a, a substrate oxide prevention chamber 502b, and a bonding location 502c (which is part of substrate oxide prevention chamber 502b). A reducing gas delivery system 508 (including bond head manifold 114, described herein) is also included in processing system 500b.

In the example shown in FIG. 5A, at least a portion of substrate oxide reduction chamber 502a has a common boundary with substrate oxide prevention chamber 502b. Substrate oxide reduction chamber 502a is closed using an entry door 502a1 (which closes an opening 502a1a) and an exit door 502a2 (which closes an opening 502a2a). Another reducing gas delivery system 502d provides a reducing gas 130 (e.g., formic acid vapor) to substrate oxide reduction chamber 502a. In the example shown in FIG. 5A, reducing gas delivery system 508 and reducing gas delivery system 502d receive reducing gas from reducing gas source 118.

After processing (e.g., removal of oxides from conductive structures of a substrate 104) in substrate oxide reduction chamber 502a, a substrate transfer system (which may be part of a material handling system including a support structure 102) is used to transfer substrate 104 through exit door 502a2 to substrate oxide prevention chamber 502b. Substrate oxide prevention chamber 502b includes an inert environment 506 (e.g., through a nitrogen supply, not shown for simplicity). A material handling system (e.g., including support structure 102) is used to move substrate 104 within substrate oxide prevention chamber 502b to a bonding location 502c. While at bonding location 502c, a reducing gas 130 is provided by reducing gas delivery system 508.

Bonding system 500 also includes a bond head assembly 106, including and/or carrying a heater 108 and a bonding tool 110 (see FIG. 1 for a more detailed description of bond head assembly 106). FIG. 5A also illustrates a main exhaust 504 which pulls exhaust gases (e.g., gases such as reducing gas vapors) through piping 504a and 114b1 (where piping 114b1 is coupled, directly or indirectly, to center channel 114b described in FIG. 1). Bond head assembly 106 carries a bond head manifold 114 for receiving and distributing fluids (e.g., gases, vapors, etc.) as desired in the given application.

Reducing gas conduit 120 is configured for carrying reducing gas 130 from reducing gas source 118 to (i) reducing gas delivery system 508 (and/or bond head manifold 114) and (ii) reducing gas delivery system 502d. Thus, reducing gas conduit 120 carries reducing gas 130 from reducing gas source 118 to a bonding area (e.g., including bonding location 502c) via reducing gas delivery system 508. Reducing gas 130 is configured for use during bonding (e.g., thermocompression bonding, flip chip bonding, etc.) of a semiconductor element 112 to a substrate 104. In the embodiment illustrated in FIG. 5A (and FIG. 5B), reducing gas conduit 120 is also configured to carry reducing gas 130 to substrate oxide reduction chamber 502a via reducing gas delivery system 502d. Substrate oxide reduction chamber 502a is configured to receive substrate 104 prior to bonding of semiconductor element 112 to the substrate 104.

Reducing gas conduit 120 includes a catalyst (e.g., where the catalyst is formed of, or includes, at least one noble metal such as platinum, palladium, gold, etc.), for producing excess reducing species in reducing gas 130 prior to reducing gas 130 reaching bonding location 502c. Reducing gas 130 is carried through a catalyst region 120a (i.e., where a catalyst is located) of reducing gas conduit 120, thereby chemically reacting with the catalyst to produce excess reducing species. A heater may be used in connection with reducing gas conduit 120 and, more specifically, catalyst region 120a (e.g., see FIGS. 7A-7B and FIG. 8). Heat provided by heater may improve the chemical reaction producing excess reducing species.

In connection with a bonding operation, semiconductor element 112 (which is carried by bond head assembly 106 into tunnel 502 through an opening 502e) is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Bond head manifold 114 provides a reducing gas 130 (e.g., where the reducing gas is a saturated vapor gas) in the area of semiconductor element 112 and substrate 104 in connection with a bonding operation (in the illustrated example, reducing gas 130 is able to enter tunnel 502 through opening 502e). After reducing gas 130 is distributed in the area of semiconductor element 112 and substrate 104, reducing gas 130 contacts surfaces of each of electrically conductive structures of semiconductor element 112 and substrate 104.

Figure 5B:
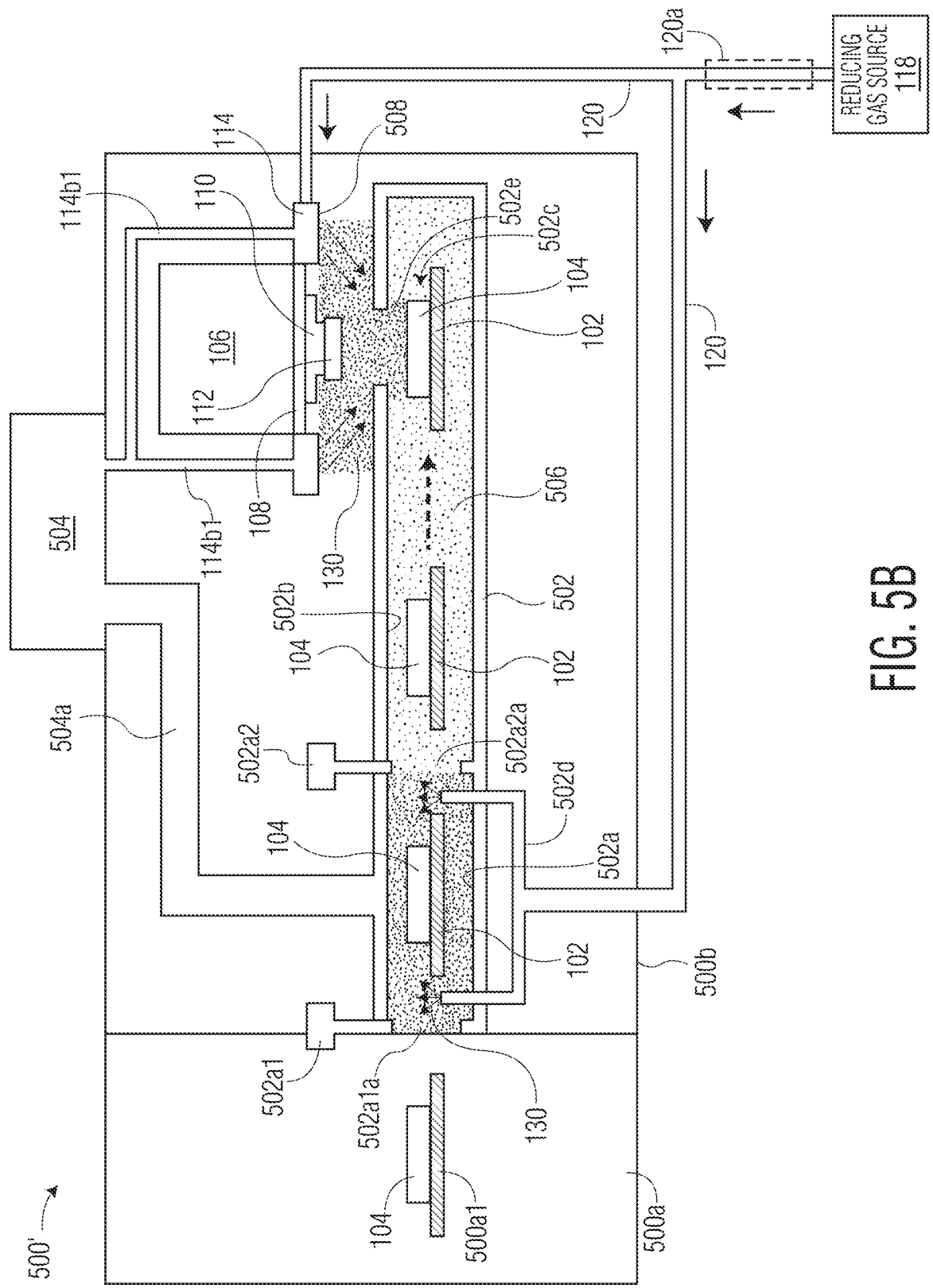

FIG. 5B illustrates a bonding system 500'. Bonding system 500' is the same as bonding system 500, except bonding system 500 illustrates multiple branches of reducing gas conduit 120 (including a plurality of catalyst regions 120a) extending from reducing gas source 118, whereas bonding system 500' illustrates a single reducing gas conduit 120 (including a single catalyst region 120a) extending from reducing gas source 118 and then branching off into two portions of reducing gas conduit 120 (i.e., one branch of reducing gas conduit 120 extending to substrate oxide reduction chamber 502a, and the other branch of reducing gas conduit 120 connecting to manifold 214). Thus, while being carried from reducing gas source 118, reducing gas 130 passes through a single catalyst region 120a in bonding system 500' and through a plurality of catalyst regions 120a in bonding system 500.

Figure 6A:
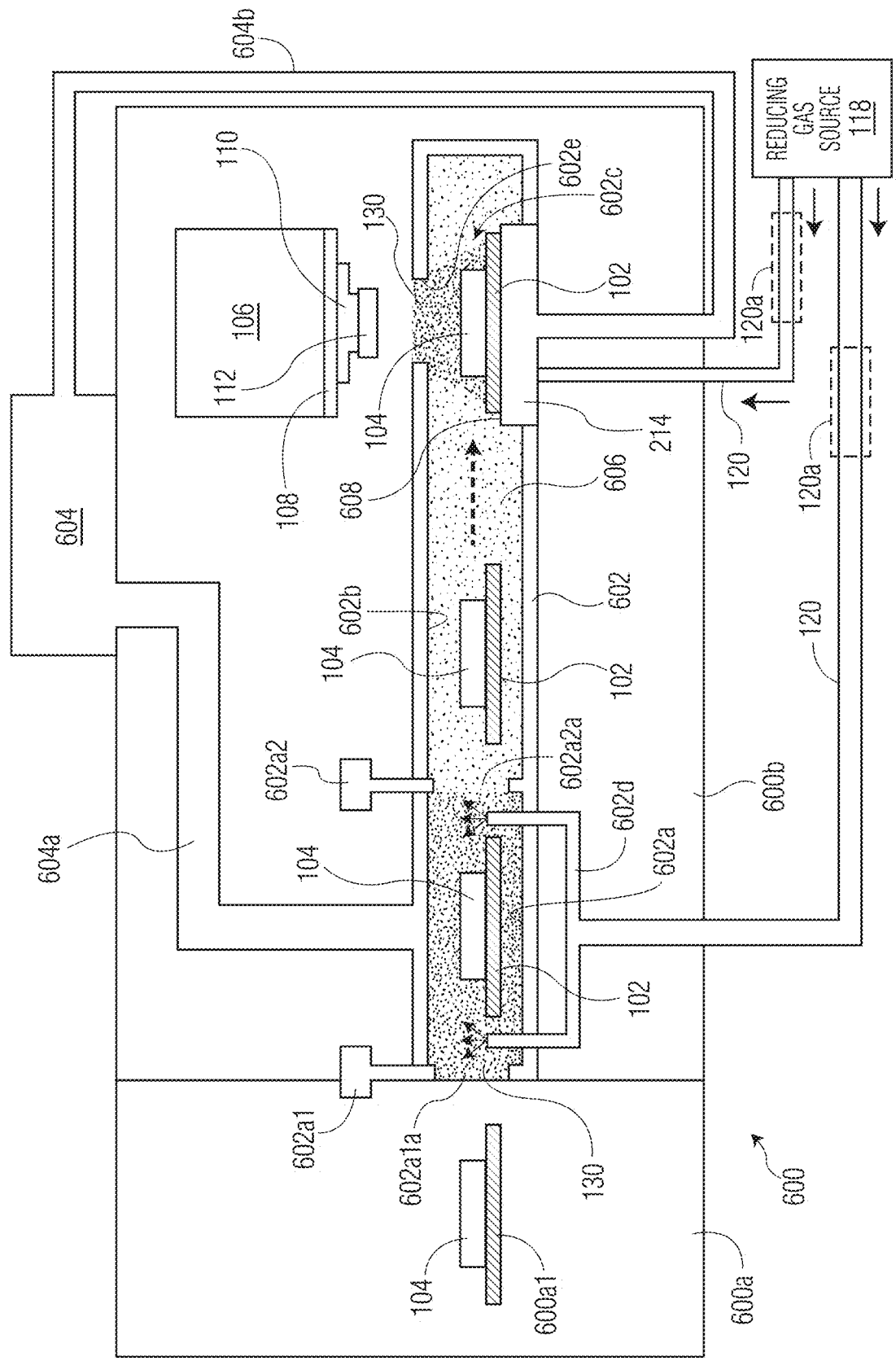

Referring now to FIGS. 6A, a bonding system 600 is illustrated. Bonding system 600 is similar in many respects to bonding system 500 of FIG. 5A and bonding system 200 of FIG. 2, where like elements have the same reference numerals, or a numeral beginning with a "6" instead of a "5", "2", or "1" (unless explicitly indicated otherwise). Bonding system 600 is essentially bonding system 500, except processing system 600b includes a reducing gas delivery system 608 (including a manifold 214 and associated structures) in lieu of reducing gas delivery system 508 (including bond head manifold 114 and associated structures) of processing system 500b. Bonding system 600 includes a substrate source 600a (e.g., a wafer handler or other source) for providing a substrate(s) 104 (such as a wafer, a printed circuit board, etc.) on a support structure 600a1. Substrate 104 is configured to be transferred to a processing system 600b (e.g., including a tunnel 602). Tunnel 602 (or another structure, as desired) includes a substrate oxide reduction chamber 602a, a substrate oxide prevention chamber 602b, and a bonding location 602c (which is part of substrate oxide prevention chamber 602b).

In the example illustrated in FIG. 6A, at least a portion of a substrate oxide reduction chamber 602a has a common boundary with a substrate oxide prevention chamber 602b. A reducing gas delivery system 608 is also included in processing system 600b. Substrate oxide reduction chamber 602a is closed using an entry door 602a1 (which closes an opening 602a1a) and an exit door 602a2 (which closes an opening 602a2a). Another reducing gas delivery system 602d (which is illustrated indirectly interconnected with reducing gas delivery system 608 to use a common source of reducing gas, namely reducing gas source 118) provides a reducing gas 130 (e.g., formic acid vapor) in substrate oxide reduction chamber 602a. After processing (e.g., removal of oxides from conductive structures of substrate 104) in substrate oxide reduction chamber 602a, a substrate transfer system (which may be part of a material handling system including a support structure 102) is used to transfer substrate 104 through opening 602a2a to substrate oxide prevention chamber 602b. Substrate oxide prevention chamber 602b includes an inert environment 606 (e.g., through a nitrogen supply, not shown for simplicity). A material handling system (e.g., including support structure 102) is used to move substrate 104 within substrate oxide prevention chamber 602b to a bonding location 602c. While at bonding location 602c, a reducing gas 130 is provided by reducing gas delivery system 608.

FIG. 6A also illustrates bond head assembly 106, including and/or carrying heater 108 and bonding tool 110 (see detailed description in connection with FIG. 1). Bonding tool 110 is capable of carrying semiconductor element 112 through opening 602e in connection with a bonding operation. FIG. 6A also illustrates main exhaust 604 which pulls exhaust gases (e.g., gases such as reducing gas vapors) through piping 604a and 604b. A manifold 214 is provided for receiving and distributing fluids (e.g., gases, vapors, etc.) as desired in the given application.

Reducing gas conduit 120 is configured for carrying reducing gas 130 from reducing gas source 118 to reducing gas delivery system 608 and then bonding area (e.g., including bonding location 602c), where reducing gas 130 is configured for use during bonding (e.g., thermocompression bonding, flip chip bonding, etc.) of semiconductor element 112 to substrate 104. In the embodiment illustrated in FIG. 6A (and FIG. 6B), reducing gas conduit 120 is configured to carry reducing gas 130 to substrate oxide reduction chamber 602a (which is configured to receive substrate 104) prior to bonding of a semiconductor element 112 to the substrate 104. Further, reducing gas conduit 120 is configured to carry reducing gas 130 to support structure 102 (e.g., via manifold 214). Reducing gas conduit 120 includes a catalyst (e.g., where the catalyst is formed of, or includes, at least one noble metal such as platinum, palladium, gold, etc.), for producing excess reducing species in reducing gas 130 prior to reducing gas 130 reaching bonding location 602c. Reducing gas 130 is carried through a catalyst region 120a (i.e., where a catalyst is located) of reducing gas conduit 120, thereby chemically reacting with the catalyst to produce excess reducing species. A heater may be used in connection with reducing gas conduit 120 and, more specifically, catalyst region 120a (e.g., see FIGS. 7A-7B and FIG. 8). Heat provided by heater may improve the chemical reaction producing excess reducing species.

Figure 6B:
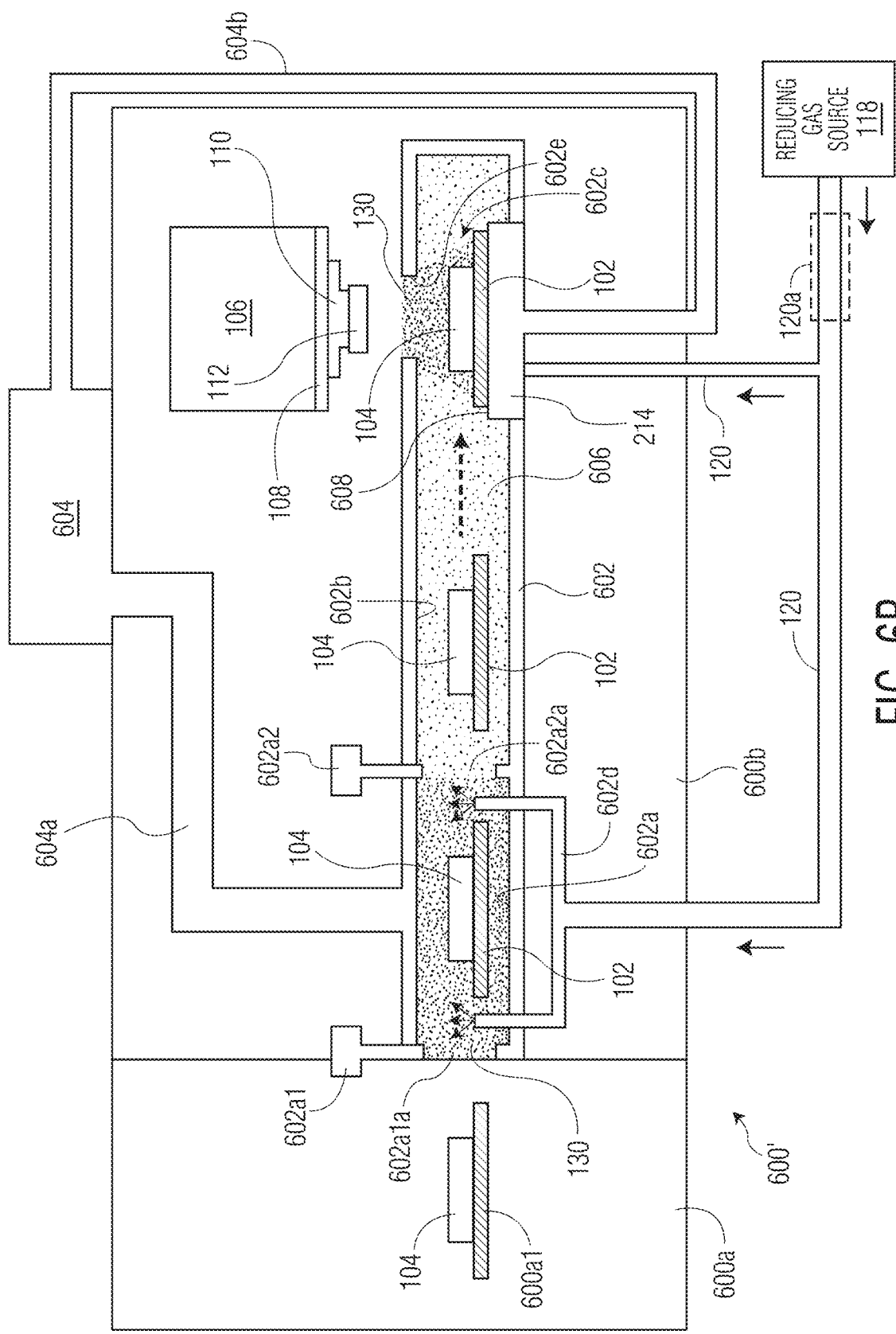

FIG. 6B illustrates bonding system 600'. Bonding system 600' is the same as bonding system 600, except bonding system 600 illustrates multiple branches of reducing gas conduit 120 (including a plurality of catalyst regions 120a) extending from reducing gas source 118, whereas bonding system 600' illustrates a single reducing gas conduit 120 (including a single catalyst region 120a) extending from reducing gas source 118 and then branching into two portions of reducing gas conduit 120 (i.e., one branch of reducing gas conduit 120 extending to substrate oxide reduction chamber 602a and the other branch of reducing gas conduit 120 connecting to manifold 214). Thus, while being carried from reducing gas source 118, reducing gas 130 passes through a single catalyst region 120a in bonding system 600' and through a plurality of catalyst regions 120a in bonding system 600.

Figure 7B:
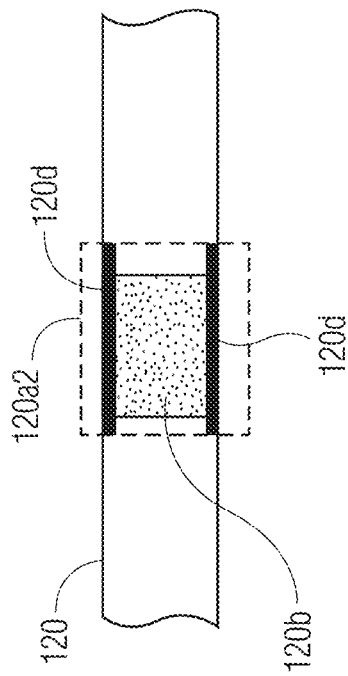
FIGS. 7A-7B are cross-sectional side views of a portion of a reducing gas conduit illustrating a catalyst region in accordance with various exemplary embodiments of the invention.
Figure 7A:
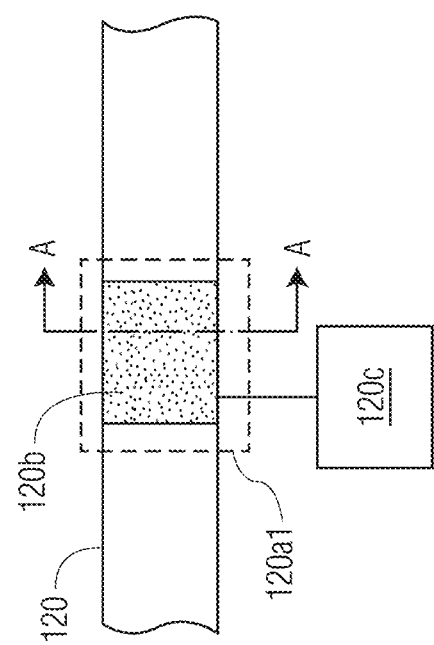
Figure 7C:
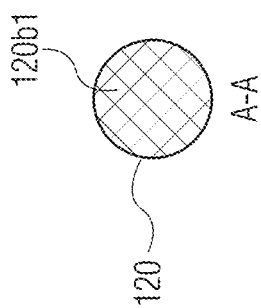
FIGS. 7C-7E are cross-sectional views taken along line A-A from FIG. 7A, illustrating exemplary catalyst configurations in accordance with various exemplary embodiments of the invention.
Figure 7D:
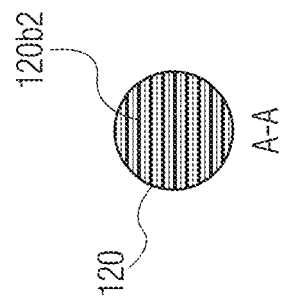
Figure 7E:
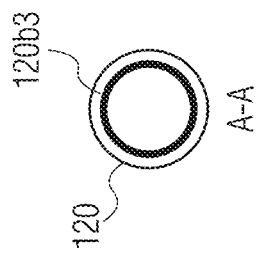
Figure 8:
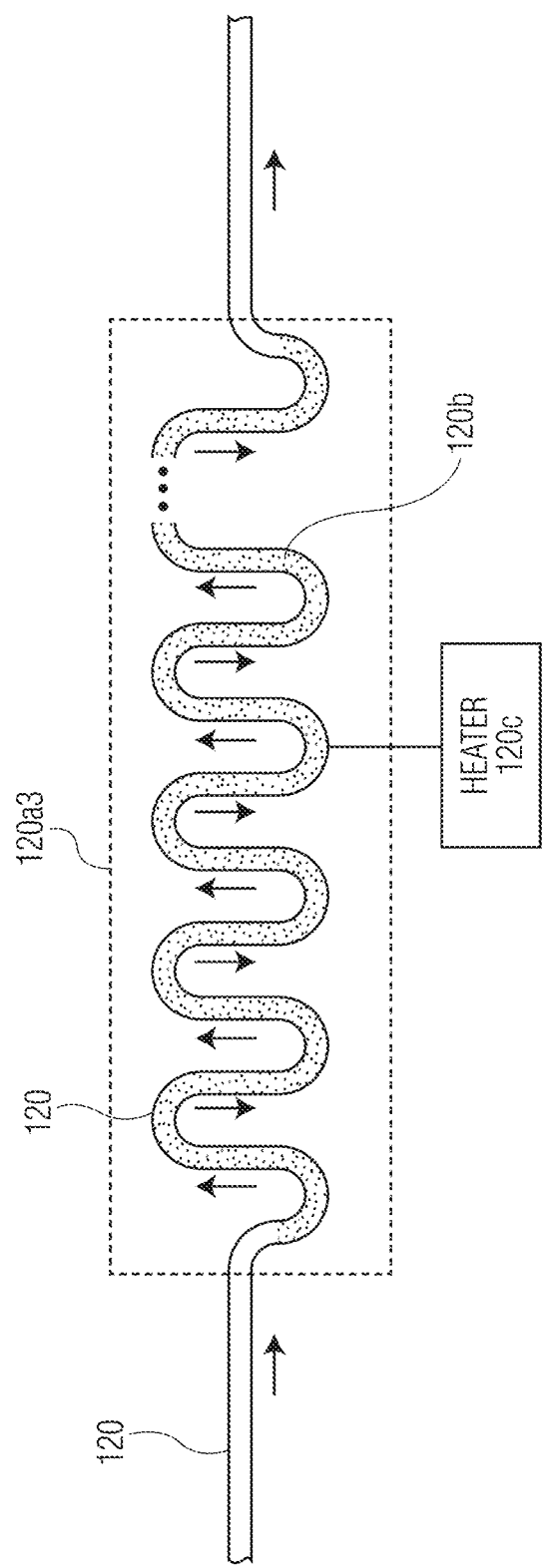
FIG. 8 is a cross-sectional side view of a portion of a reducing gas conduit in a serpentine configuration illustrating a catalyst region in accordance with an exemplary embodiment of the invention.

Referring now to FIG. 7A, a cross-section of a portion of an exemplary reducing gas conduit 120 is illustrated (e.g., where reducing gas conduit 120 illustrated in FIGS. 7A-7B and FIG. 8 and the catalyst configurations shown in FIGS. 7C-7E are examples of the reducing gas conduits 120 illustrated and described throughout the present application). Reducing gas conduit 120 includes a catalyst region 120a1 (which may extend along any portion of reducing gas conduit 120 as desired in the specific application). Catalyst region 120a1 includes a catalyst 120b. Catalyst 120b is contained within reducing gas conduit 120 and may be structured in several different configurations (e.g., see mesh configuration 120b1 of FIG. 7C, perforated block configuration 120b2 of FIG. 7D, and inner surface configuration 120b3 of FIG. 7E, among others). Reducing gas conduit 120 also includes a heater 120c. Heater 120c is illustrated as a block diagram connected to reducing gas conduit 120 and, more specifically, connected to catalyst region 120a1. In FIG. 7A, heater 120c is configured to heat catalyst 120b to a temperature to facilitate the production of excess reducing species in a reducing gas (e.g., 100° C., 150° C., 200° C.). Heater 120c may be used to control the temperature, for example, using closed loop controls (e.g., while a measured temperature is used to control the heating).

Referring now to FIG. 7B, a cross-section of a portion of another example reducing gas conduit 120 is illustrated. Reducing gas conduit 120 includes a catalyst region 120a2. Catalyst region 120a2 includes a catalyst 120b. Catalyst 120b is contained within reducing gas conduit 120 and may be structured in several different configurations (e.g., see mesh configuration 120b1 of FIG. 7C, perforated block configuration 120b2 of FIG. 7D, and inner surface configuration 120b3 of FIG. 7E, among others). Reducing gas conduit 120 also includes a heater 120d (or a plurality of heaters). As compared to heater 120c in FIG. 7A, heater 120d is illustrated as an inline heater connected to catalyst region 120a2. In FIG. 7B, heater 120d is configured to heat catalyst 120b to a temperature to facilitate the production of excess reducing species in a reducing gas (e.g., 100° C., 150° C., 200° C.). Heater 120d may be used to control the temperature, for example, using closed loop controls (e.g., while a measured temperature is used to control the heating).

As provided above, catalyst 120b of catalyst region 120a1 in FIG. 7A (or catalyst 120a2 of FIG. 7B) of reducing gas conduit 120 may be provided in several different configurations. Examples of such catalyst configurations are illustrated in FIGS. 7C-7E (as section view A-A of FIG. 7A). In accordance with certain exemplary embodiments of the invention, the entire structure of a catalyst may be formed of a noble metal. In other exemplary embodiments, the structure of a catalyst may include a noble metal (e.g., a noble metal coating on another structure).

Referring specifically to FIG. 7C, a mesh configuration 120b1 of catalyst 120b is illustrated. In this embodiment, catalyst 120b (e.g., formed of or including a noble metal) is formed as an interlaced structure with openings to allow a reducing gas (e.g., reducing gas 130) to flow through reducing gas conduit 120. This embodiment may desirably provide a large surface area of catalyst to interact with reducing gas.

Referring now to FIG. 7D, a perforated block configuration 120b2 of catalyst 120b is illustrated. In this configuration, catalyst 120b (e.g., formed of or including a noble metal) is formed as a structure with a plurality of slots (or apertures) to allow a reducing gas to flow therebetween.

Referring now to FIG. 7E, an inner surface configuration 120b3 of catalyst 120b is illustrated. In this configuration, catalyst 120b is provided on an inner surface of reducing gas conduit 120. This configuration may provide less surface area with which a reducing gas may interact (as compared to the configuration of FIGS. 7C-7D) but may allow for greater reducing gas flow.

It should be understood that these configurations are exemplary in nature and are not intended to limit the configuration of a catalyst to the illustrated examples. For example, a combination of one or more configurations (e.g., a mesh configuration 120b1 in combination with an inner surface configuration 120b3) with one or more materials is contemplated.

Referring now to FIG. 8, a cross-section of a portion of a reducing gas conduit 120 in a "serpentine configuration" is illustrated. Reducing gas conduit 120 includes a catalyst region 120a3 (including a catalyst 120b) and a heater 120c. The "serpentine configuration" may be desirable in certain applications. For example, such a configuration provides more efficient utilization of space in a bonding system.

Further, such a configuration provides a circuitous path for the reducing gas, causing the reducing gas to better interact with catalyst 120b (e.g., by increasing surface area, increasing the duration of flow through the conduit, increasing non-laminar flow of the reducing gas, increasing friction between the reducing gas and the catalyst, etc.). Although FIG. 8 illustrates a "serpentine configuration", the invention is not limited thereto (e.g., alternate configurations include spirals/helixes, right angle elbow transitions, returning branches (to increase turbulence), etc.). The circuitous path configuration could include one or more of the configurations illustrated and described in FIGS. 7C-7E, among others.

Figure 9:
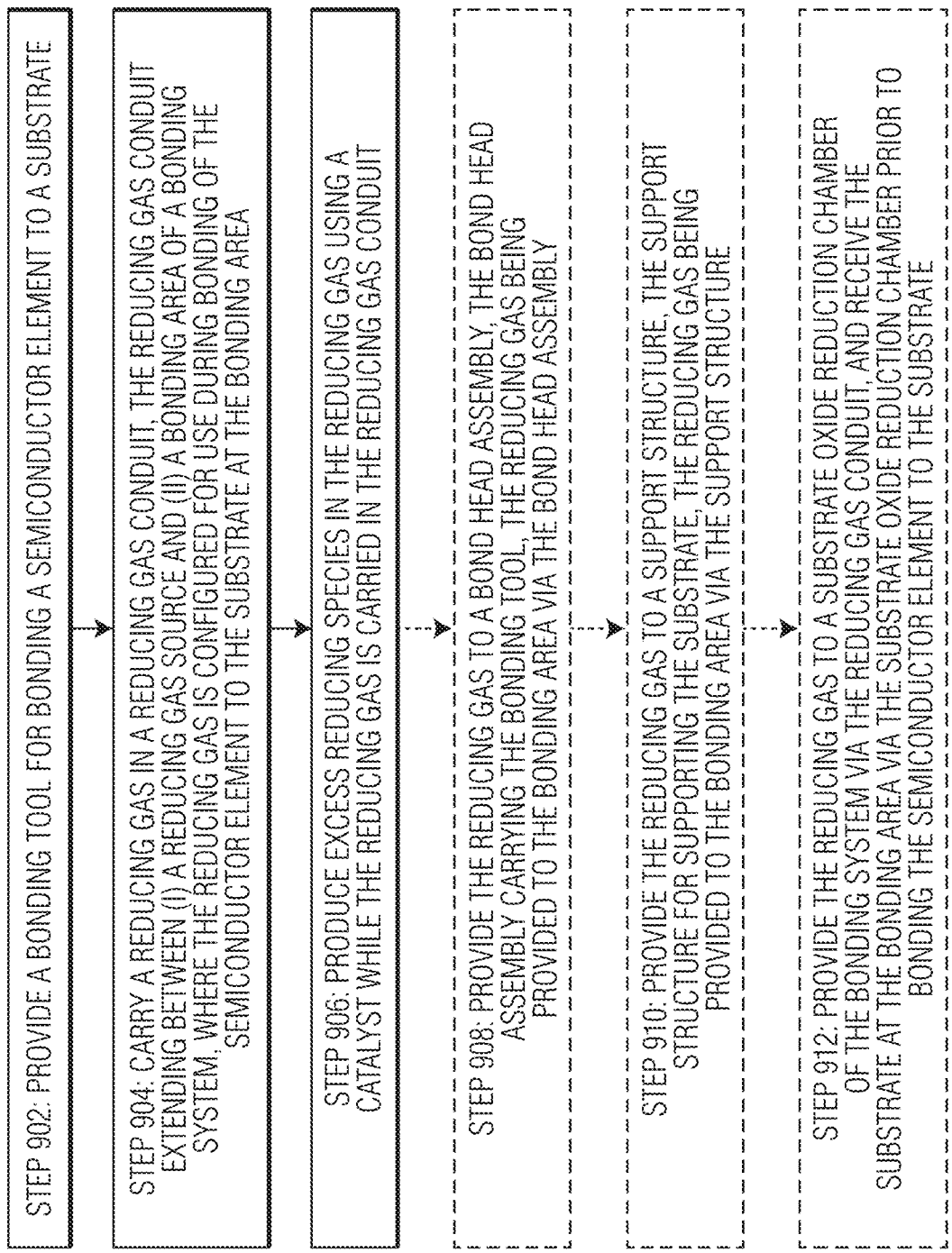
FIGS. 9-11 are various flow diagrams of methods of providing a reducing gas on a bonding system in accordance with various exemplary embodiments of the invention.
Figure 10:
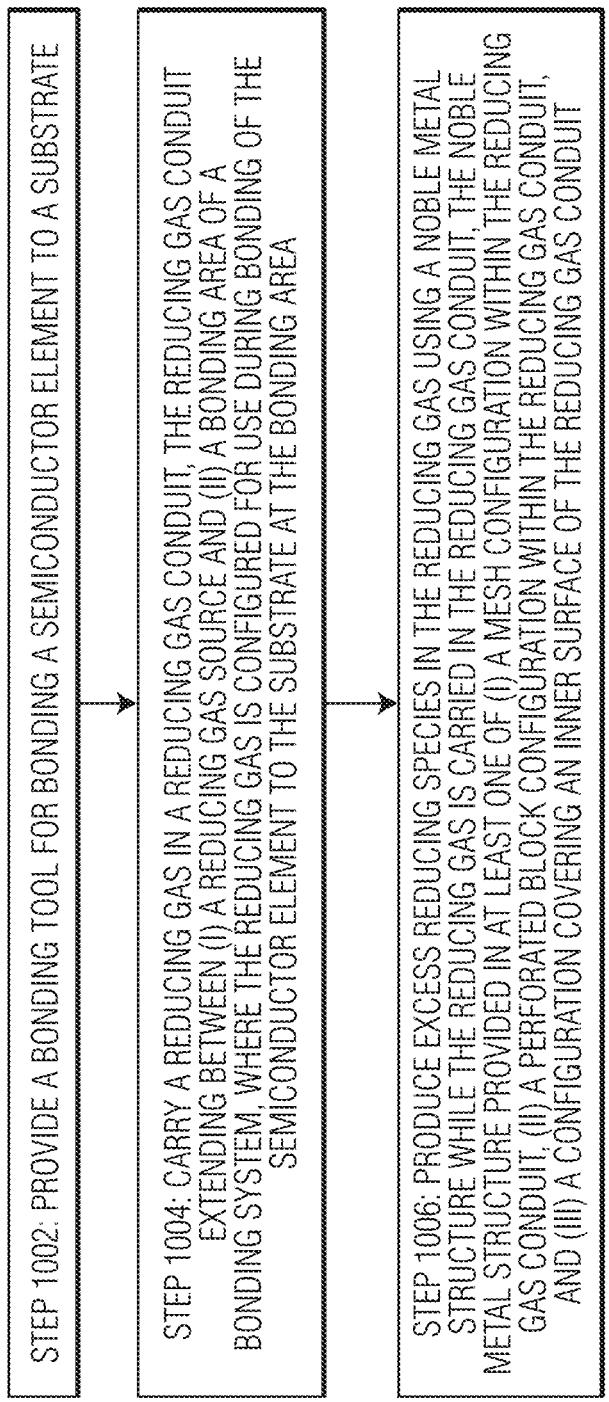
Figure 11:
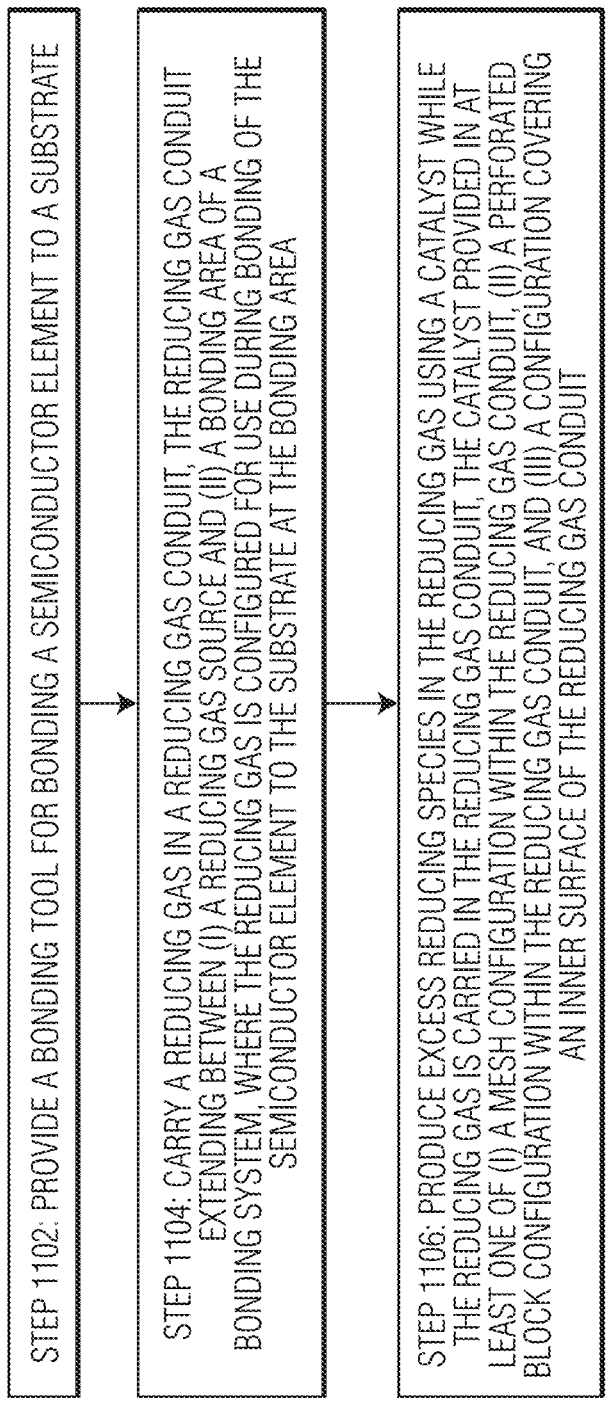

FIGS. 9-11 are flow diagrams illustrating various methods of providing a reducing gas on a bonding system. As is understood by those skilled in the art, certain steps included in the flow diagram may be omitted; certain additional steps may be added; and the order of the steps may be altered from the order illustrated-all within the scope of the invention.

Referring now to FIG. 9, at Step 902, a bonding tool for bonding a semiconductor element to a substrate is provided (e.g., see bonding tool 110, semiconductor element 112, and substrate 104 throughout the drawings). At Step 904, a reducing gas is carried in a reducing gas conduit, the reducing gas conduit extending between (i) a reducing gas source and (ii) a bonding area of a bonding system, where the reducing gas is configured for use during bonding of the semiconductor element to the substrate at the bonding area (e.g., see reducing gas 130, reducing gas conduit 120, reducing gas source 118, and the bonding areas throughout the drawings). At Step 906, excess reducing species (e.g., H+ ions) are produced in the reducing gas using a catalyst (e.g., where the catalyst is formed of, or includes, at least one noble metal such as platinum, palladium, gold, etc.) while the reducing gas is carried in the reducing gas conduit (e.g., the reducing gas 130 passes through catalyst region 120a and therefore contains excess reducing species, as illustrated throughout the various drawings). During Step 906, the catalyst may be heated with a heating element (e.g., an inline heater, heater 120c of FIG. 7A, heater 120d of FIG. 7B, etc.). Such heating may improve the chemical process in connection with the production of excess reducing species.

At optional Step 908, the reducing gas is provided to the bond head assembly, the bond head assembly carrying the bonding tool, the reducing gas being provided to the bonding area via the bond head assembly (e.g., see FIGS. 1, 3, and 5A-5B). At optional Step 910, the reducing gas is provided to a support structure, the support structure for supporting the substrate, the reducing gas being provided to the bonding area via the support structure (e.g., see FIGS. 2, 4, and 6A-6B). At optional Step 912, the reducing gas is provided to a substrate oxide reduction chamber of the bonding system via the reducing gas conduit (e.g., see FIGS. 5A-5B and FIGS. 6A-6B), and the substrate is received at the bonding area via the substrate oxide reduction chamber prior to bonding the semiconductor element to the substrate.

Referring now to FIG. 10, at Step 1002, a bonding tool for bonding a semiconductor element to a substrate is provided (e.g., see bonding tool 110, semiconductor element 112, and substrate 104 throughout the drawings). At Step 1004, a reducing gas is carried in a reducing gas conduit, the reducing gas conduit extending between (i) a reducing gas source and (ii) a bonding area of a bonding system, where the reducing gas is configured for use during bonding of the semiconductor element to the substrate at the bonding area (e.g., see reducing gas 130, reducing gas conduit 120, reducing gas source 118, and bonding areas throughout the drawings). At Step 1006, excess reducing species (e.g., H+ ions) are produced in the reducing gas using a noble metal structure (e.g., where the catalyst is formed of, or includes, at least one noble metal such as platinum, palladium, gold, etc.) while the reducing gas is carried in the reducing gas conduit, the noble metal structure provided in at least one of (i) a mesh configuration within the reducing gas conduit, (ii) a perforated block configuration within the reducing gas conduit, and (iii) a configuration covering an inner surface of the reducing gas conduit (e.g., see the various configurations illustrated in FIGS. 7C-7E).

Referring now to FIG. 11, at Step 1102, a bonding tool for bonding a semiconductor element to a substrate is provided (e.g., see bonding tool 110, semiconductor element 112, and substrate 104 throughout the drawings). At Step 1104, a reducing gas is carried in a reducing gas conduit, the reducing gas conduit extending between (i) a reducing gas source and (ii) a bonding area of a bonding system, where the reducing gas is configured for use during bonding of the semiconductor element to the substrate at the bonding area (e.g., see reducing gas 130, reducing conduit 120, reducing gas source 118, and bonding area 122 throughout the drawings). At Step 1106, excess reducing species (e.g., H+ ions) are produced in the reducing gas using a catalyst (e.g., where the catalyst is formed of, or includes, at least one noble metal such as platinum, palladium, gold, etc.) while the reducing gas is carried in the reducing gas conduit, the catalyst provided in at least one of (i) a mesh configuration within the reducing gas conduit, (ii) a perforated block configuration within the reducing gas conduit, and (iii) a configuration covering an inner surface of the reducing gas conduit (e.g., see the various configurations illustrated in FIGS. 7C-7E).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of providing a reducing gas on a bonding system, the method comprising the steps of:
    (a) providing a bonding tool for bonding a semiconductor element to a substrate, the bonding tool being carried by a bond head assembly, the bond head assembly also carrying a bond head manifold, the bond head manifold for receiving a reducing gas from a reducing gas source and for providing the reducing gas to a bonding area of the bonding system;
    (b) carrying the reducing gas in a reducing gas conduit, the reducing gas conduit extending between (i) the reducing gas source and (ii) the bonding area of a bonding system, where the reducing gas is configured for use during bonding of the semiconductor element to the substrate at the bonding area; and
    (c) producing excess reducing species in the reducing gas using a catalyst while the reducing gas is carried in the reducing gas conduit, the catalyst being included in a portion of the reducing gas conduit included in the bond head manifold.

2. The method of claim 1 wherein the catalyst includes a noble metal.

3. The method of claim 1 further comprising the step of providing the reducing gas to the bond head assembly, the reducing gas being provided to the bonding area via the bond head assembly.

4. The method of claim 1 wherein step (c) includes heating the catalyst with a heater.

5. The method of claim 1 wherein the excess reducing species produced in step (c) include H+ ions.

6. The method of claim 1 wherein the catalyst is provided in the reducing gas conduit in a mesh configuration.

7. The method of claim 1 wherein the catalyst is provided in the reducing gas conduit in a perforated block configuration.

8. The method of claim 1 wherein the catalyst is provided on an inner surface of the reducing gas conduit.

9. The method of claim 1 further comprising the steps of (d) providing the reducing gas to a substrate oxide reduction chamber of the bonding system via the reducing gas conduit and (e) receiving the substrate at the bonding area via the substrate oxide reduction chamber prior to bonding the semiconductor element to the substrate.

10. A method of providing a reducing gas on a bonding system, the method comprising the steps of:
(a) providing a bonding tool for bonding a semiconductor element to a substrate, the bonding tool being carried by a bond head assembly, the bond head assembly also carrying a bond head manifold, the bond head manifold for receiving a reducing gas from a reducing gas source and for providing the reducing gas to a bonding area of the bonding system;
(b) carrying the reducing gas in a reducing gas conduit, the reducing gas conduit extending between (i) the reducing gas source and (ii) the bonding area of a bonding system, where the reducing gas is configured for use during bonding of the semiconductor element to the substrate at the bonding area; and
(c) producing excess reducing species in the reducing gas using a noble metal structure while the reducing gas is carried in the reducing gas conduit, the noble metal structure provided in at least one of (i) a mesh configuration within the reducing gas conduit, (ii) a perforated block configuration within the reducing gas conduit, and (iii) a configuration covering an inner surface of the reducing gas conduit, the noble metal structure being included in a portion of the reducing gas conduit included in the bond head manifold.

11. The method of claim 10 wherein the noble metal structure is a catalyst for producing the excess reducing species in the reducing gas.

12. The method of claim 10 wherein the excess reducing species include H+ ions.

13. The method of claim 10 further comprising the step of providing the reducing gas to the bond head assembly, the reducing gas being provided to the bonding area via the bond head assembly.

14. The method of claim 10 wherein step (c) includes heating the noble metal structure with a heater.

15. The method of claim 10 further comprising the steps of (d) providing the reducing gas to a substrate oxide reduction chamber of the bonding system via the reducing gas conduit and (e) receiving the substrate at the bonding area via the substrate oxide reduction chamber prior to bonding the semiconductor element to the substrate.

16. A method of providing a reducing gas on a bonding system, the method comprising the steps of:
(a) providing a bonding tool for bonding a semiconductor element to a substrate, the bonding tool being carried by a bond head assembly, the bond head assembly also carrying a bond head manifold, the bond head manifold for receiving a reducing gas from a reducing gas source and for providing the reducing gas to a bonding area of the bonding system;
(b) carrying the reducing gas in a reducing gas conduit, the reducing gas conduit extending between (i) the reducing gas source and (ii) the bonding area of a bonding system, where the reducing gas is configured for use during bonding of the semiconductor element to the substrate at the bonding area; and
(c) producing excess reducing species in the reducing gas using a catalyst while the reducing gas is carried in the reducing gas conduit, the catalyst provided in at least one of (i) a mesh configuration within the reducing gas conduit, (ii) a perforated block configuration within the reducing gas conduit, and (iii) a configuration covering an inner surface of the reducing gas conduit, the catalyst being included in a portion of the reducing gas conduit included in the bond head manifold.

17. The method of claim 16 wherein the excess reducing species include H+ ions.

18. The method of claim 16 further comprising the step of providing the reducing gas to the bond head assembly, the reducing gas being provided to the bonding area via the bond head assembly.

19. The method of claim 16 wherein step (c) includes heating the catalyst with a heater.

20. The method of claim 16 further comprising the steps of (d) providing the reducing gas to a substrate oxide reduction chamber of the bonding system via the reducing gas conduit and (e) receiving the substrate at the bonding area via the substrate oxide reduction chamber prior to bonding the semiconductor element to the substrate.

\* \* \* \* \*